(12) United States Patent
Shumarayev

(10) Patent No.: US 7,279,924 B1
(45) Date of Patent: Oct. 9, 2007

(54) EQUALIZATION CIRCUIT CELLS WITH HIGHER-ORDER RESPONSE CHARACTERISTICS

(75) Inventor: Sergey Yuryevich Shumarayev, San Leandro, CA (US)

(73) Assignee: Altera Corporation, San Jose, CA (US)

( * ) Notice: Subject to any disclaimer, the term of this patent is extended or adjusted under 35 U.S.C. 154(b) by 131 days.

(21) Appl. No.: 11/183,281

(22) Filed: Jul. 14, 2005

(51) Int. Cl.
*H03K 17/16* (2006.01)

(52) U.S. Cl. .................. 326/21; 326/81; 327/109; 327/280

(58) Field of Classification Search ........... 326/21, 326/30, 81, 83
See application file for complete search history.

(56) References Cited

U.S. PATENT DOCUMENTS

| 5,218,244 | A | * | 6/1993 | Nokubo | 326/67 |
| 6,121,812 | A | * | 9/2000 | Tsukikawa | 327/280 |
| 6,124,740 | A | * | 9/2000 | Klemmer | 327/109 |
| 6,566,961 | B2 | * | 5/2003 | Dasgupta et al. | 330/301 |

* cited by examiner

*Primary Examiner*—Vibol Tan
(74) *Attorney, Agent, or Firm*—Ropes & Gray LLP

(57) ABSTRACT

Equalization circuitry includes additional components to boost the performance of the circuitry to a higher-order response. The additional components are preferably controllably variable so that the response can be adjusted to perform a wide range of equalization tasks. For example, the equalization circuitry can be used on signals received from connections having a wide range of signal propagation characteristics and/or on signals having a wide range of data rates, including data rates that can be very high.

24 Claims, 3 Drawing Sheets

EQUALIZATION CIRCUIT CELLS WITH HIGHER-ORDER RESPONSE CHARACTERISTICS

BACKGROUND OF THE INVENTION

This invention relates to equalization circuitry.

Signals received by a system component, such as a programmable logic device ("PLD"), may benefit from initial processing of the type known as equalization. For example, one objective of equalization may be to restore crispness or sharpness to level transitions in a received data or clock signal. The circuitry originating the signal may transmit it with sharp transitions, but the sharpness of those transitions may be degraded by the medium (e.g., printed circuit board ("PCB") traces) through which the signal must travel to reach the receiver. Especially at very high data rates, it can be important for the receiver circuitry to first restore the sharpness to transitions in the received signal so that further circuitry of the receiver can process that signal properly and accurately at the high data rate. This is the (or at least one) function of equalization circuitry that may be included in the receiver.

Programmable logic devices ("PLDs") are examples of circuit components that are typically made with the intention that they can be used in a wide variety of systems. The manufacturer of a PLD does not know the specifics of all the systems in which the PLD will be used. To give the PLD a large potential market, the manufacturer tries to give the PLD a wide range of capabilities. The user of the PLD can then customize the PLD to meet a user's particular needs by appropriately programming or otherwise controlling various aspects of the PLD's circuitry. Equalization is a capability that a PLD may be advantageously equipped with, and if so, then a wide range of equalization response, with flexible programmable or other control, is desirable. In this way the equalization circuitry of the PLD can be customized by a user to allow the PLD to compensate for many different types and/or degrees of degradation in a received signal.

One possible way to accomplish the foregoing is to provide several equalization cells on a PLD in series. Each of the equalization cells is programmable or otherwise controllable to some degree, and the number of cells that are connected in series may also be selectable (e.g., by programming or other control). A possible shortcoming of this approach is that to produce a higher-order response that may be needed for very high data rates, a larger-than-desirable number of equalization cells may need to be connected in series. Overall system performance may be degraded by such a circuit configuration.

SUMMARY OF THE INVENTION

In accordance with this invention, an equalization cell circuit having a higher-order response is provided. In addition, at least some of the circuit components that are added to give the cell higher-order response are preferably controllable to extend the range over which the cell can be controlled to operate.

Further features of the invention, its nature and various advantages, will be more apparent from the accompanying drawings and the following detailed description.

DETAILED DESCRIPTION

Figure 1:
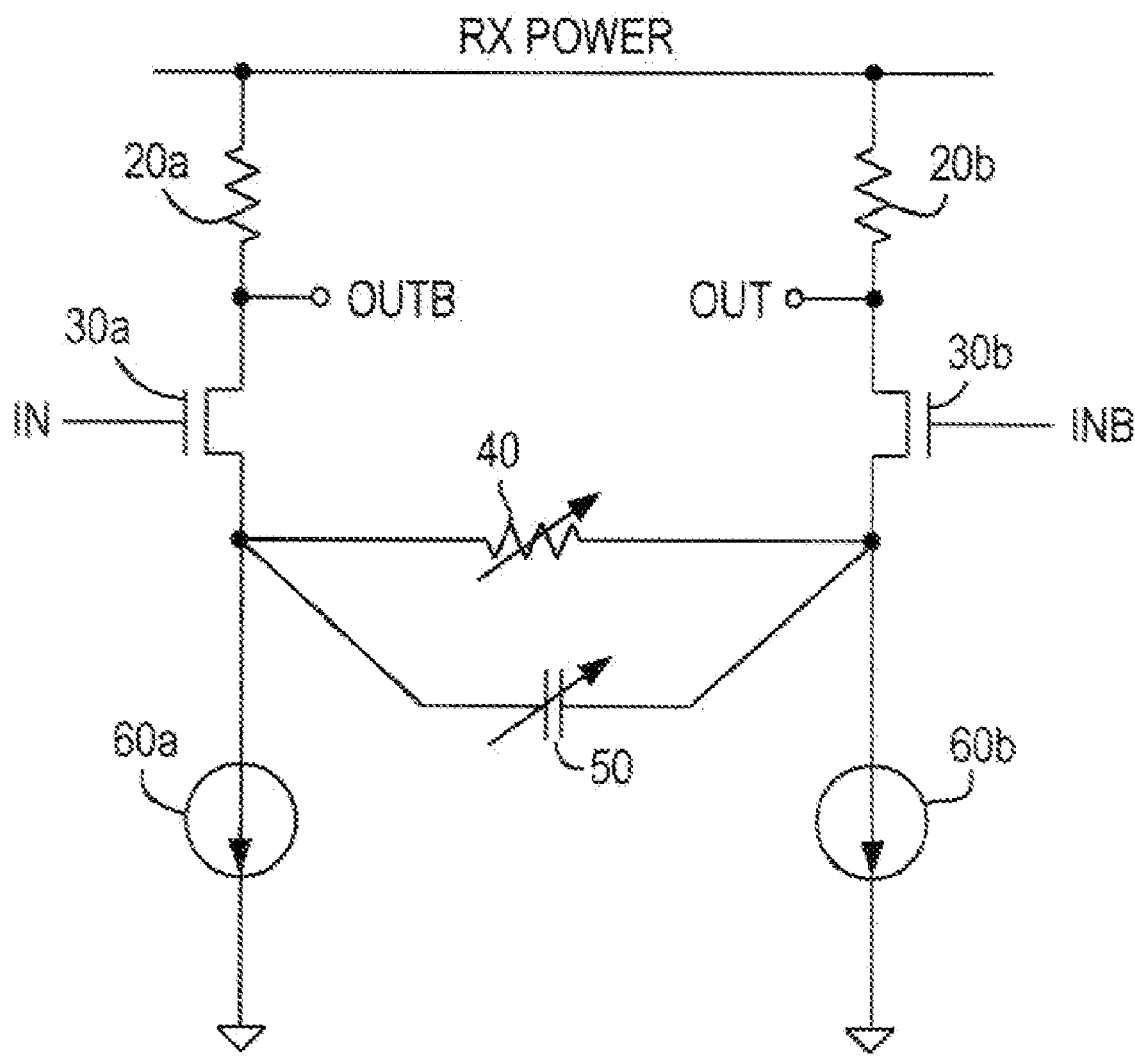
FIG. 1 is a simplified schematic diagram of a conventional equalization cell circuit.

The conventional equalization cell circuit 10 shown in FIG. 1 includes resistor 20a, NMOS transistor 30a, and current source 60a connected in series between a receiver ("RX") power bus and ground. Cell 10 also includes resistor 20b, NMOS transistor 30b, and current source 60b connected between the RX power bus and ground. Variable resistor 40 is connected between (1) a node between transistor 30a and current source 60a and (2) a node between transistor 30b and current source 60b. Variable capacitor 50 is connected in parallel with resistor 40 between those two nodes. "True" and "complement" versions of the input signal to be equalized are respectively connected to the gates of transistors 30a and 30b. The equalized output signal in (true and complement forms) is available at nodes OUT and OUTB.

The equalization response of circuit 10 is controllable by varying the resistance of resistor 40 and/or by varying the capacitance of capacitor 50. Assuming that cell 10 is part of the circuitry of a PLD, components 40 and 50 may be controlled by signals from other circuitry of the PLD. For example, these control signals may be signals that come from programmable configuration bits of the PLD. In this case these control signals will be relatively static (e.g., they will have values that are only changeable by reprogramming or reconfiguring the PLD). Alternatively, these signals may be more dynamic signals that come from circuitry of the PLD that supplies signals that can vary in value during normal logic operation of the PLD.

Figure 2:
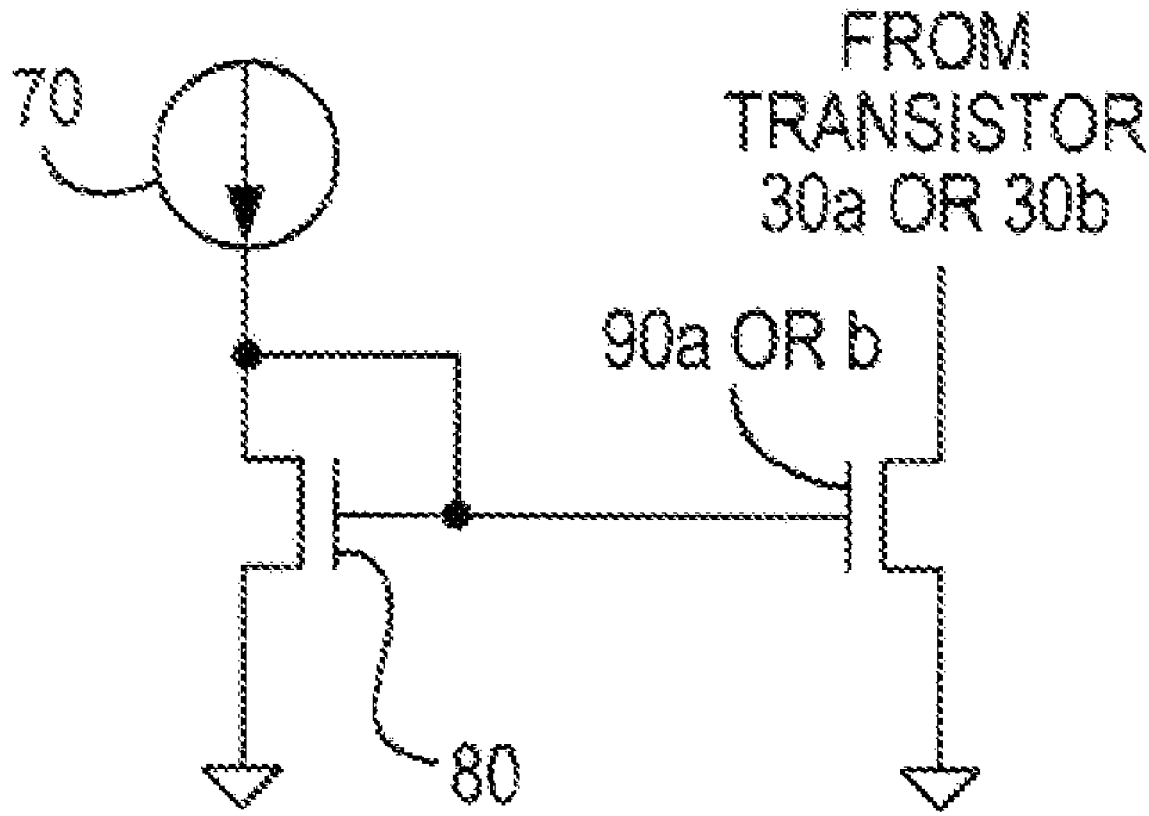
FIG. 2 is a simplified schematic diagram of a conventional implementation of certain components shown in FIG. 1.

A typical embodiment of a current source 60a and/or 60b in FIG. 1 is shown in FIG. 2. This circuitry is current mirror and current source circuitry that includes current source 70 connected in series with NMOS transistor 80, and NMOS transistor 90a or 90b. The gates of transistors 80 and 90a or 90b are tied together, and they are also tied to a node between current source 70 and transistor 80.

The circuitry shown in FIGS. 1 and 2 is illustrative of equalization cell circuitry of the type referred to in the Background section of this specification. The equalization response of this cell can be varied, but it is not capable of very high-order response (i.e., a response having a transfer function that includes very high frequency components). Thus a number of such cells may need to be cascaded (connected in series) to get to high-order responses. But that approach has the possible disadvantage of unacceptable degradation of overall system performance.

Figure 3:
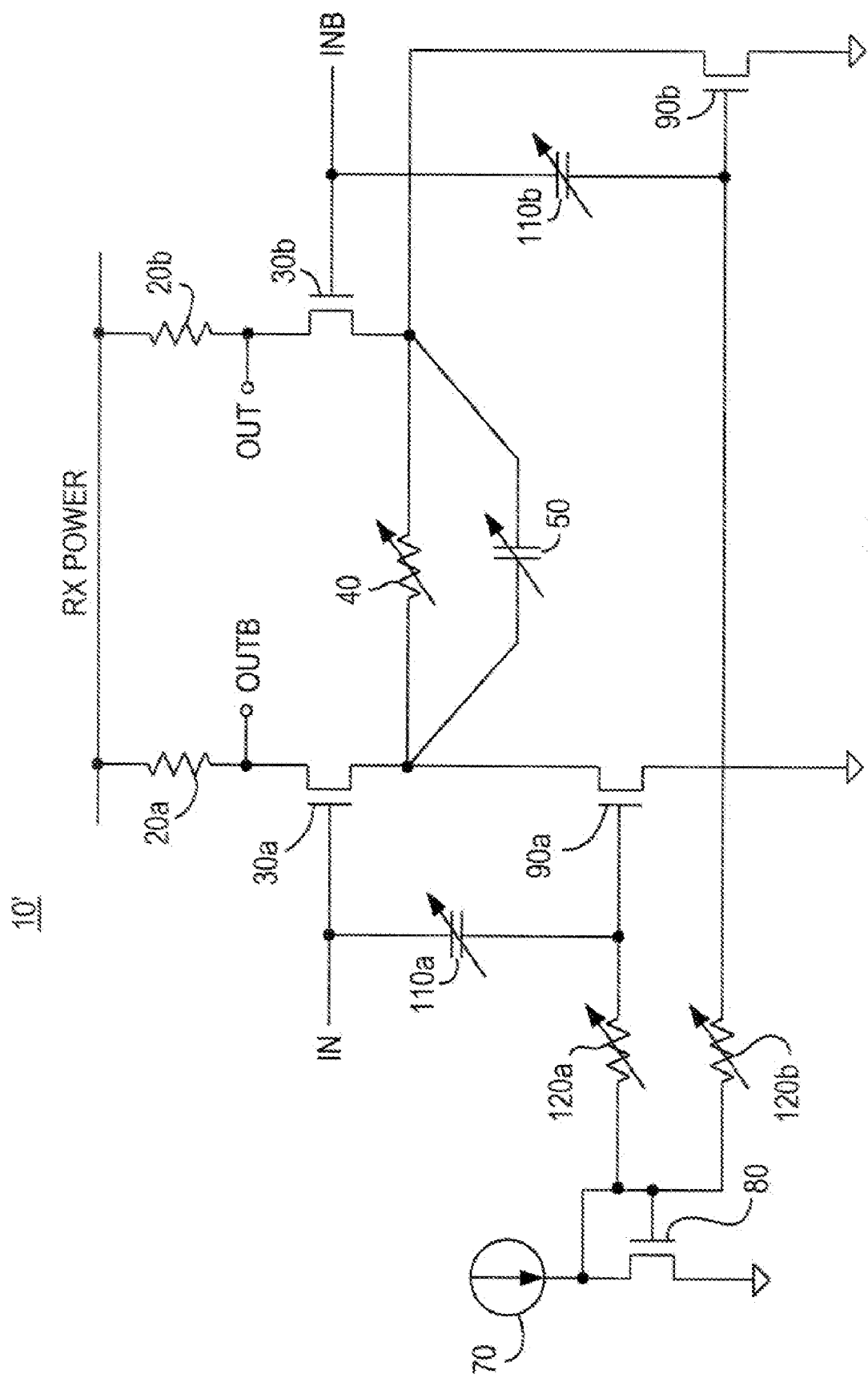
FIG. 3 is a simplified schematic diagram of an illustrative embodiment of an equalization cell circuit in accordance with the present invention.

FIG. 3 show how circuitry of the general type shown in FIGS. 1 and 2 can be modified in accordance with this invention to produce a higher-order equalization cell 10'. Elements in FIG. 3 that are similar to elements in FIGS. 1 and 2 have the same reference numbers again in FIG. 3. Elements in FIG. 3 that are new as compared to what is shown in FIGS. 1 and 2 have three-digit reference numbers. Only these new elements will need to be described in detail in connection with FIG. 3 because the other elements have already been described in connection with FIGS. 1 and 2.

FIG. 3 shows the addition of dedicated coupling capacitor 110a between input node IN and the gate of the transistor 90a in the current-source/current-mirror circuitry for the left-hand leg of cell 10'. A second dedicated coupling capacitor 110b is connected between input node INB and the gate of the transistor 90b in the current-source/current-mirror circuitry for the right-hand leg of cell 10'. Capacitors 110a and 110b are preferably of variable (controllable) capacitance. Damping resistor 120a is connected in series in the link between the gates of transistors 80 and 90a. In particular, resistor 120a is connected between (1) a node in the shunt from current source 70 to the gate of transistor 80 and (2) a node between capacitor 110a and the gate of transistor 90a. Damping resistor 120b is connected in series in the link between the gates of transistors 80 and 90b. In particular, resistor 120b is connected between (1) a node in the shunt from current source 70 to the gate of transistor 80 and (2) a node between capacitor 110b and the gate of transistor 90b. Resistors 120a and 120b are preferably of variable (controllable) resistance.

Addition of the two coupling devices 110a and 110b between the two input pins IN and INB and the corresponding tail current sources allows the incoming data to couple to its current source bias line (i.e., the gate leads of transistor 90a and 90b). For example, when the IN signal goes high, it will couple high (via capacitor 110a) its current source bias line (gate lead of transistor 90a), temporarily creating a higher-than-quiescent amount of current through transistor 30a. This, in turn, will lead to fast discharge of the OUTB node. When node IN finishes transitioning, there will be no charge flowing through coupling capacitor 110a, and hence the bias-line will return back to bias voltage. Also note that as node IN is transitioning high in this example, node INB must be transitioning low. Via coupling capacitor 110b, this creates a temporary deficiency in the current source (transistor 90b) of transistor 30b. This, in turn, allows a faster charging time of node OUT.

The result of the circuit operation described in the preceding paragraph is additional equalization boost added to the conventional equalization building cell. The value of each coupling capacitor 110a and 110b is preferably controllably variable so that various amounts of boost can be applied to input connections having a wide range of signal propagation characteristics. Two damping resistors 120a and 120b are connected from common current mirror (including elements 70 and 80) to each individual current source transistor 90a and 90b. The values of these resistors are also preferably controllably variable to allow for various data rates, which is a requirement for wide-range receiver circuitry.

As a result of the foregoing, not only central equalizer capacitor 50 can be controllably varied, but independent coupling capacitors 110a and 110b can be set so that higher-order equalization can be achieved by new building cell 10'.

All of the various options described above for selecting or controlling the values of components 40 and 50 are equally applicable to selecting or controlling the values of components 110a, 110b, 120a, and 120b. For example, if circuitry 10' is on a PLD, these components can be controlled by signals from other circuitry of the PLD. Moreover, these control signals can be relatively static (e.g., from programmable elements of the PLD) or more dynamic (e.g., from logic, memory, processor, or other such circuitry of the PLD).

It will be understood that the foregoing is only illustrative of the principles of the invention, and that various modifications can be made by those skilled in the art without departing from the scope and spirit of the invention. For example, although FIG. 3 shows one set of components 70 and 80 serving both of transistors 90a and 90b, it will be understood that each of these transistors could alternatively have its own set of components 70 and 80.

The invention claimed is:

1. Equalization circuitry comprising:
   a first resistor, a first transistor, and a first current source connected in series;
   an input node connected to a gate of the first transistor;
   an output node connected between the first resistor and the first transistor;
   a first coupling capacitor connected between the input node and a bias node of the first current source, the coupling capacitor creating a change in current through the transistor in response to a change in voltage at the input node;
   a second transistor, complementary to the first transistor, wherein the second transistor is coupled to a node between the first transistor and the first current source;
   a second current source connected in series to the second transistor; and
   a second coupling capacitor connected between a gate of the second transistor and a bias node of the second current source.

2. The circuitry defined in claim 1 wherein the coupling capacitor has controllably variable capacitance.

3. The circuitry defined in claim 1 wherein the current source comprises a second transistor, and wherein the bias node is connected to a gate of the second transistor.

4. The circuitry defined in claim 1 wherein the current source comprises:
   a second transistor whose gate comprises the bias node; and
   additional bias-supplying circuitry connected to the bias node.

5. The circuitry defined in claim 4 wherein the additional bias-supplying circuitry comprises:
   current source circuitry connected in series with a third transistor, the current source circuitry being additionally connected to a gate of the third transistor; and
   a damping resistor connected between the gate of the third transistor and the bias node.

6. The circuitry defined in claim 5 wherein the damping resistor has controllably variable resistance.

7. Equalization circuitry comprising:
   a resistor, a transistor, and a current source connected in series;
   an input node connected to a gate of the transistor;
   an output node connected between the resistor and the transistor;
   a coupling capacitor connected between the input node and a bias node of the current source;
   a second resistor, a second transistor, and a second current source connected in series;
   a complementary input node connected to a gate of the second transistor;
   a complementary output node connected between the second resistor and the second transistor; and
   a second coupling capacitor connected between the complementary input node and a bias node of the second current source.

8. The circuitry defined in claim 7 wherein the second coupling capacitor has controllably variable capacitance.

9. The circuitry defined in claim 7 further comprising:
   a third capacitor connected between (1) a first node between the transistor and the current source and (2) a second node between the second transistor and the second current source.

10. The circuitry defined in claim 9 wherein the third capacitor has controllably variable capacitance.

11. The circuitry defined in claim 9 further comprising:
a third resistor connected between the first and second nodes.

12. The circuitry defined in claim 11 wherein the third resistor has controllably variable resistance.

13. Equalization circuitry comprising:
a first resistor, a first transistor, and a first current source transistor connected in series;
a second resistor, a second transistor, and a second current source transistor connected in series;
a capacitor connected between a first node between the first transistor and the first current source transistor and a second node between the second transistor and the second current source transistor;
an input node connected to a gate of the first transistor;
a complementary input node connected to a gate of the second transistor;
an output node connected between the second resistor and the second transistor;
a complementary output node connected between the first resistor and the first transistor;
bias source circuitry connected to a gate of the first current source transistor and to a gate of the second current source transistor;
a first coupling capacitor connected between the input node and the gate of the first current source transistor; and
a second coupling capacitor connected between the complementary input node and the gate of the second current source transistor.

14. The circuitry defined in claim 13 wherein the capacitor has variable capacitance.

15. The circuitry defined in claim 13 wherein the first coupling capacitor has variable capacitance.

16. The circuitry defined in claim 13 wherein the second coupling capacitor has variable capacitance.

17. The circuitry defined in claim 13 further comprising:
a third resistor connected between the first and second nodes.

18. The circuitry defined in claim 17 wherein the third resistor has variable resistance.

19. The circuitry defined in claim 13 wherein the bias source circuitry comprises:
current source circuitry connected in series with a third transistor, the current source circuitry being also connected to a gate of the third transistor;
a third resistor connected between the gate of the third transistor and the gate of the first current source transistor; and
a fourth resistor connected between the gate of the third transistor and the gate of the second current source transistor.

20. The circuitry defined in claim 19 wherein the third resistor has variable resistance.

21. The circuitry defined in claim 19 wherein the fourth resistor has variable resistance.

22. Equalization circuitry comprising:
a first series connection of a first resistor, a first transistor, and a first current source transistor;
a second series connection of a second resistor, a second transistor, and a second current source transistor, the first and second series connections being parallel to one another;
first and second complementary input nodes connected to gates of the first and second transistors, respectively;
first and second complementary output nodes connected, respectively, between (1) the first resistor and the first transistor and (2) the second resistor and the second transistor;
bias source circuitry connected to a gate of the first current source transistor and a gate of the second current source transistor;
a variable capacitor connected between a first node between the first transistor and the first current source transistor and a second node between the second transistor and the second current source transistor; and
first and second variable coupling capacitors connected, respectively, between the first and second input nodes and the gates of the first and second current source transistors.

23. The circuitry defined in claim 22 further comprising a variable resistor connected between the first and second nodes.

24. The circuitry defined in claim 22 wherein the bias source circuitry is connected to the gates of the first and second current source transistors via first and second variable resistors, respectively.

* * * * *